United States Patent
Tinsley et al.

[11] Patent Number: 5,914,643
[45] Date of Patent: *Jun. 22, 1999

[54] SOURCE COUPLED CMOS CRYSTAL OSCILLATOR

[75] Inventors: Steven Tinsley, Garland; Fernando Carvajal, McKinney, both of Tex.

[73] Assignee: Texas Instruments Incorporated, Dallas, Tex.

[21] Appl. No.: 08/989,611

[22] Filed: Dec. 12, 1997

Related U.S. Application Data

[60] Provisional application No. 60/032,732, Dec. 13, 1996.

[51] Int. Cl.⁶ .................................................. H03B 5/36
[52] U.S. Cl. ........................................ 331/116 FE; 331/158
[58] Field of Search .......................... 331/116 R, 116 FE, 331/158

[56] References Cited

U.S. PATENT DOCUMENTS 3,996,530  12/1976  Feistel et al. ..................... 331/116 R
5,347,237  9/1994  Rokos ............................ 331/116 FE Primary Examiner—Siegfried H. Grimm
Attorney, Agent, or Firm—W. James Brady, III; Richard L. Donaldson

[57] ABSTRACT

A CMOS oscillator includes two differential input transistors (150) and (152) which have the sources thereof coupled through a resonator element (196). Active loads (166) and (178) provide a squaring up of the output which then drives an output transistor (202). The gates of the differential input transistors (150) and (152) are biased to predetermined voltage levels with bias circuits, with the positive input of the comparator configuration coupled through a feedback capacitor (208) to the output (204). This provides sufficient instability to initiate oscillation with a gain of the device controlled by resonator circuit (196) to be optoimum at the resonant frequency of the resonator circuit.

7 Claims, 2 Drawing Sheets

5,914,643

SOURCE COUPLED CMOS CRYSTAL OSCILLATOR

This application claims priority under 35 USC § 119(e)(1) of provisional application number 60/032,732 filed Dec. 13, 1996.

TECHNICAL FIELD OF THE INVENTION

The present invention pertains in general to oscillator circuits and, more particularly, to a CMOS oscillator.

BACKGROUND OF THE INVENTION

In the design of the microcontroller for integrated circuits, the oscillator is typically integrated into the microcontroller design on the same chip to accommodate applications wherein space, size and current draw are critical parameters. These integrated oscillators, when operating in the megahertz range, most commonly utilize a pair of CMOS inverters. One inverter is utilized as the oscillator gain element and the other as a buffer. This type of oscillator has some disadvantages in that the inverters operate in a linear region at all times, thus drawing significant current during most of the oscillation cycle. The current draw of such a circuit is proportionate to the strength of the transistor, which is dependent on production, temperature and supply voltage by a factor of approximately 10-to-1. Additionally, these oscillators tend to operate from rail to rail, such that the frequency spectrum output therefrom is fairly "rich."

One solution to the above-noted problem of high current draw is to utilize an NMOS common source amplifier with a current source load. This circuit, often referred as a Pierce oscillator, yields high gain with relatively low and constant power. The output buffer for this type of oscillator is a comparator circuit with one input tied to the input of the amplifier and the other input tied to the output of the amplifier. This allows the amplitude in the oscillator to remain small, while the output of the comparator is capable of switching external circuits quickly, keeping such circuits out of linear region. Optimization of the circuit for any crystal resonant frequency requires only the adjustment of the values of the gate-to-source capacitor and the drain-to-source capacitor.

Whenever an external resonator is the only external device associated with the oscillator, and the circuit is required to perform over a wide range of clock frequencies and resonator types, problems can arise. In most integrated circuit applications, the oscillator circuit is optimized to run over a relatively narrow frequency range, with the frequency of oscillator set by an external quartz crystal. However, when a customer requests a new version of the circuit, or a different clock frequency, this usually requires the oscillator circuit to be redesigned. Such oscillator circuits can require radical changes, this often resulting in longer product redesign cycles, extensive simulation and optimization, new test techniques, and larger die size requirements.

SUMMARY OF THE INVENTION

The present invention disclosed and claimed herein comprises an integrated circuit oscillator. The oscillator includes a first differential leg having a first differential transistor with the source/drain path thereof connected between a first current source and an active load. A second differential leg is also provided having the source/drain path thereof connected between a second current source and the active load. The first and second differential legs are combined to form a differential comparator with a resonator element disposed between the sources of the first and second differential transistors. The resonator element operates such that the differential gain of the first and second differential legs is optimum at the resonant frequency of the resonant element. Bias circuitry is provided for biasing the gates of the first and second differential transistors to predetermined voltage levels. The drain of the second differential transistor provides the output of the oscillator which drives the gate of an output transistor. The source/drain path of the output transistor is disposed between an output node and ground. A feedback element is connected between the output node and the gate of the second differential transistor to provide a positive feedback thereto.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
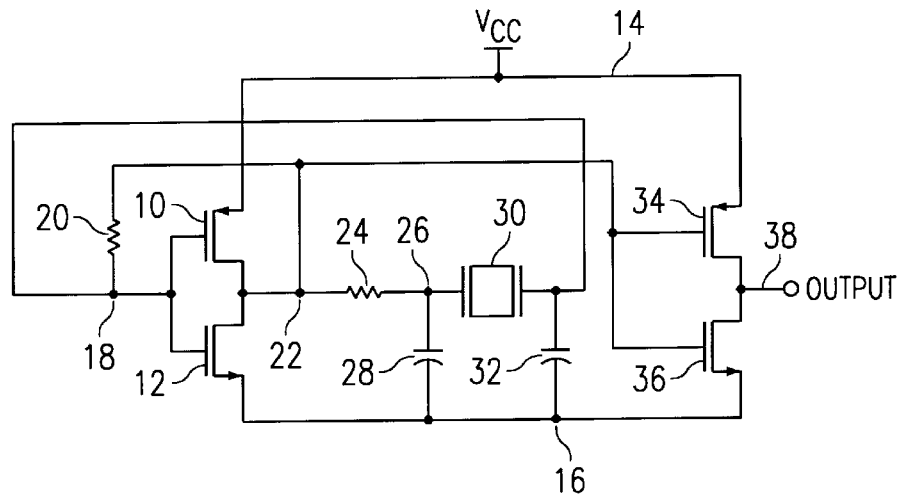
FIG. 1 illustrates a prior art inverter oscillator.

Referring now to FIG. 1, there is illustrated a schematic diagram of a prior art inverter oscillator. A conventional CMOS inverter is formed of a P-channel transistor 10 and an N-channel transistor 12 having the drains thereof connected together, with the source of transistor 10 connected to a $V_{cc}$ power supply rail 14 and the source of transistor 12 connected to a ground rail 16. The gates of transistors 10 and 12 are connected together and to a common node 18. A resistor 20 is connected between the node 18 and a node 22, which node 22 is connected to the drains of the transistors 10 and 12. A resistor 24 is connected between node 22 and a node 26, node 26 connected to one side of a capacitor 28 and also to one side of a resonator element 30. The other side of capacitor 28 is connected to node 16 and the other side of resonator element 30 is connected to the node 18. A capacitor 32 is connected between node 18 and ground rail 16. Node 22 is connected to the gates of two CMOS transistors, P-channel transistor 34 and N-channel transistor 36 configured as a CMOS inverter. The drains of the transistors 34 and 36 are connected together and to an output node 38, with the source of transistor 34 connected to the power supply rail 14 and the source of transistor 36 connected to the ground rail 16. This is a conventional inverter oscillator, wherein the transistors 10 and 12 provide the gain element with the output thereof connected to the input of the resonator element 30 with the other side of the resonator element connected to the input, such that the inverter of the resonator element 30 is connected between the output and input of the inverter. The transistors 34 and 36 provide a buffered inverting output.

Figure 2:
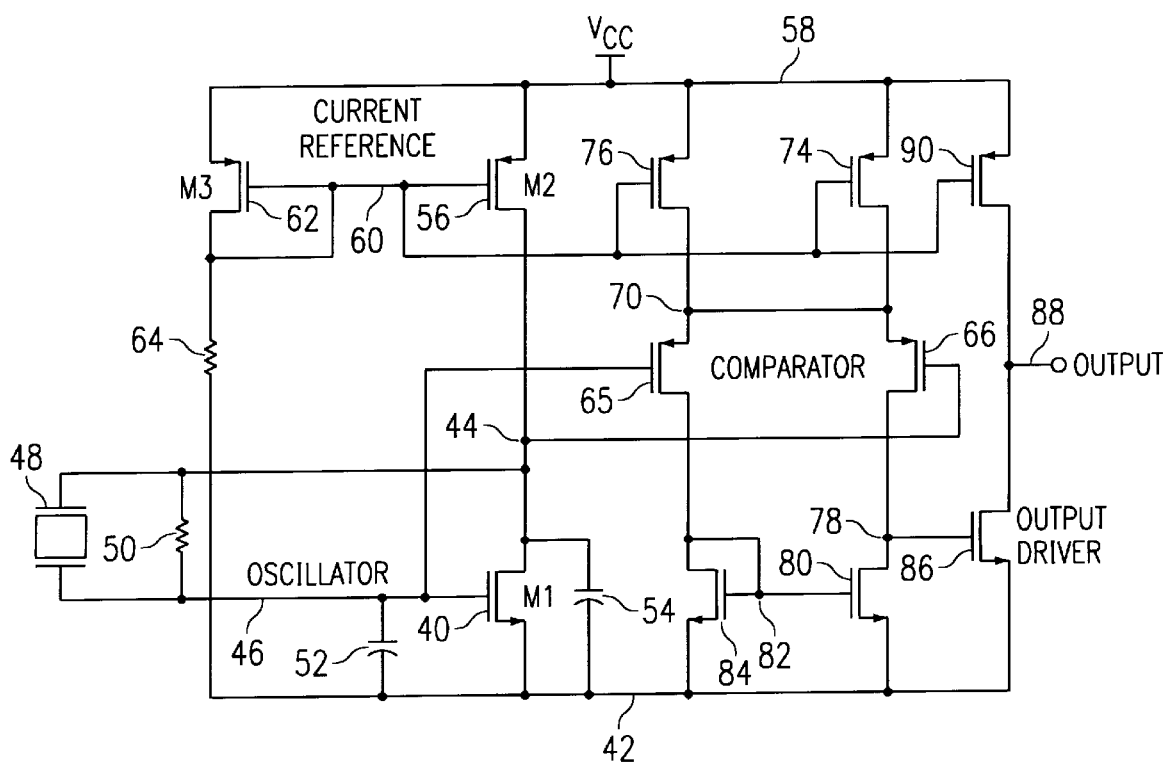
FIG. 2 illustrates a prior art Pierce oscillator circuit.

Referring now to FIG. 2, there is illustrated a prior art Pierce oscillator configuration with a comparator output. The oscillator element is provided by an NMOS transistor 40, which has the source thereof connected to a ground node 42, the drain thereof connected to a common drain node 44, and the gate thereof connected to a node 46. A crystal 48 is connected between node 46 and node 44, this being an external element which requires two pads (not shown). A one MegOhm resistor 50 is connected in parallel with the crystal 48. A 10 pF capacitor 52 is connected across the gate-to-source of transistor 40 between node 46 and the ground node 42. A 10 pF capacitor 54 is connected between the node 44 and the ground node 42.

The bias for the transistor 40 is provided by a P-channel transistor 56 having the source thereof connected to a power supply rail 58 and the drain thereof connected to the common drain node 44, the gate of transistor 56 connected to a node 60. The bias for transistor 56 is provided by a bias circuit comprised of a diode-connected P-channel transistor 62 having the source thereof connected to the power supply rail 58, the drain and gate thereof connected to node 60 and to one side of a resistor 64, the other side of resistor 64 connected to the ground rail 42. The current through transistor 62 is mirrored over to the transistor 56 to set the bias of transistor 40. The oscillation signal provided by the transistor 40 is a small signal sinusoidal oscillation signal, the oscillator being effectively a common drain oscillator.

The common drain node 44 is connected to the gate of transistor 66 which forms a differential pair with transistor 65. The gate of transistor 65 is connected to the node 46. The sources of both transistors 66 and 65 are connected together to a node 70, node 70 connected through the source/drain paths of two P-channel transistors 74 and 76, each having the drains thereof connected to drain 70 and the sources thereof connected to power supply rail 58. The gates of transistors 74 and 76 are connected to the node 60, such that the current through transistor 62 is mirrored over to transistors 74 and 76. The drain of transistor 66 is connected to a node 78 and also to the drain of an N-channel transistor 80, the source of transistor 80 connected to the ground rail 42 and the gate thereof connected to a gate node 82. Similarly, the drain of transistor 65 is connected to node 82, node 82 connected to the gate and drain of an N-channel transistor 84, the source thereof connected to the ground rail 42. The transistors 80 and 84 provide an active load for transistors 65 and 66, with transistors 65 and 66 therein configured as a comparator. The transistor 66 will turn on whenever the voltage on node 44 falls one threshold below the source thereof, with the active loads 80 and 84 providing a "squaring" function for the voltage on node 78. This node 78 then drives an output driver transistor 86, with the N-channel transistor having the gate thereof connected to node 78, the source thereof connected to the ground rail 42, and the drain thereof connected to an output node 88. Current is provided to the output driver 86 through a P-channel transistor 90 having the source thereof connected to the power supply rail 58, the drain thereof connected to the output node 88, and the gate thereof connected to the node 60 to allow the current through transistors 62 to be mirrored to transistor 90. The disadvantage to the Pierce oscillator circuit is that the current through transistor 40 must be relatively high, on the order of 100 microamps for a four megahertz oscillator.

Figure 3:
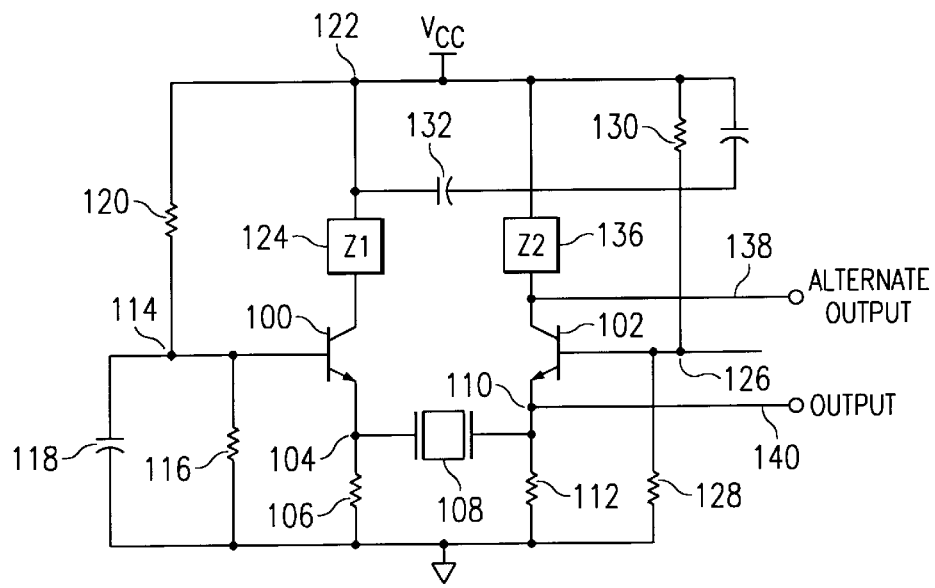
FIG. 3 illustrates a prior art Butler oscillator circuit.

Referring now to FIG. 3, there is illustrated a schematic diagram of a Butler oscillator, which is a bi-polar oscillator having an emitter-coupled configuration. This configuration is described in Benjamin Parzen, "Design of Crystal and other Harmonic Oscillators," *John Wiley & Sons*, 1983 and J. Groslambert, G. Marianneau, M. Oliver and J. Ubersfeld, "The Design and Performance of a Crystal Oscillator Exhibiting Improved Short-Term Frequency Stability," *Proc. 28th Annual Symposium on Frequency Control*, U. S. Army Electronics Command, Fort Monmouth, N.J. Pp. 181–183, 1974. The Butler oscillator is comprised of two NPN bipolar transistors 100 and 102. Transistor 100 has the emitter thereof connected to a node 104, node 104 connected to one side of a resistor 106, the other side thereof connected to ground, and also node 104 is connected to one side of a crystal resonator element 108. Similarly, transistor 102 has the emitter thereof connected to a node 110, node 110 connected to one side of a resistor 112, the other side thereof connected to ground and node 110 also connected to the other side of the resonator 108. The gate of transistor 100 is connected to a node 114, node 114 connected to one side of a resistor 116, the other side of resistor 116 connected to ground. Node 114 is also connected to one side of a capacitor 118, the other side thereof connected to ground. Node 114 is also connected to one side of a resistor 120, the other side thereof connected to the power supply rail 122. The collector of transistor 100 is connected to one side of a load 124, the other side thereof connected to the power supply rail 122. The transistor 102 has the base thereof connected to a node 126, node 126 connected to one side of a resistor 128, the other side thereof connected to ground. Node 126 is also connected to one side of resistor 130, the other side thereof connected to a power supply rail 122. Additionally, node 126 is connected to one side of a feedback capacitor 132, the other side thereof connected to the power supply side of the load 124, capacitor 132 labeled $C_{FB}$. The collector of transistor 102 is connected to one side of a load 136, the other side thereof connected to a power supply rail 122. The collector of transistor 102 comprises an alternate output node 138, with the emitter of transmitter 102 comprising an output node 140.

Figure 4:
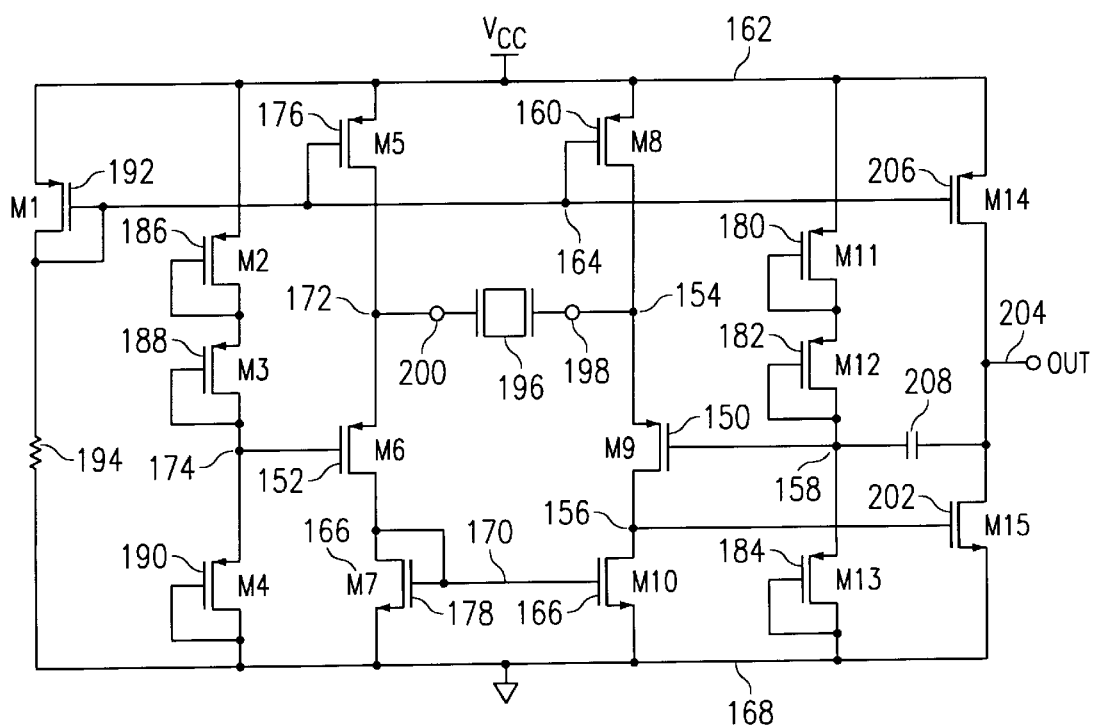
FIG. 4 illustrates the preferred embodiment of the clock driver of the present invention.

Referring now to FIG. 4, there is illustrated a schematic diagram of the preferred embodiment of the present invention. In the preferred embodiment, a comparator structure is utilized with, in effect, the output fed back to the positive input with an internal resonant element affecting the gain, such that the gain is highest (peaks) only at the resonant frequency of the resonator element. The input or gain element of the oscillator is provided by two differential CMOS transistors 150 and 152. Transistor 150 has the source thereof connected to a node 154, the drain thereof connected to a node 156 and the gate thereof connected to a node 158. Node 154 is connected to the drain of the P-channel transistor 160, the source thereof connected to a power supply rail 162 and the gate thereof connected to a node 164, transistor 160 setting the bias current to transistor 150. An active load for transistor 150 is provided by an N-channel transistor 166, the drain thereof connected to the node 156, the source thereof connected to a ground rail 168 and the gate thereof connected to a node 170.

The transistor 152 is connected similar to transistor 150, with the source thereof connected to a node 172, the drain thereof connected to the node 170 and the gate thereof connected to a node 174. Node 172 is connected to a P-channel transistor 176, the drain thereof connected to the node 172, the source thereof connected to the power supply rail 162, and the gate thereof connected to the node 164, transistor 176 providing a current source for transistor 152. An active load is provided by an NMOS transistor 178, the drain and gate thereof connected to node 170 and the source thereof connected to the ground supply rail 168.

A bias voltage for the gate of transistor 150 is provided by three diode-connected P-channel transistors 180, 182 and 184, connected in series. Transistor 180 has the source thereof connected to the power supply rail and the drain and gate thereof connected to the source of transistor 182. Transistor 182 has the gate and drain thereof connected to the node 158, with the transistor 184 having the source thereof connected to node 158 and the gate and drain thereof connected to the ground supply rail 168. In effect, transistors 180, 182 and 184 provide a voltage divider to set a voltage at a node 158, with the voltage being defined by the relative sizes of the transistors 180, 182 and 184. In a similar manner, the voltage to the gate of transistor 152 is set by three diode-connected P-channel transistors 186, 188 and 190. Transistor 186 has the source thereof connected to the power supply rail 162 and the gate and drain thereof connected to the source of transistor 188. Transistor 188 has the gate and drain thereof connected to node 174, with node 174 connected to the source of transistor 190. Transistor 190 has the gate and drain thereof connected to the ground supply rail 168. The bias voltages on the gates of the transistors 150 and 152 can be offset by the design of the transistors 180–190.

The bias for the transistors 160 and 176 is provided by a current source comprised of a P-channel transistor 192 having the source thereof connected to the power supply rail and the gate and drain thereof connected to a node 164. A resistor 194 is connected between the node 164 and ground. The current through transistor 192 is mirrored over to the transistors 160 and 176 to provide the bias current therethrough.

The sources of transistors 150 and 152 are coupled together through a crystal resonator 196 that is coupled on one side thereof to node 154 through an external pad 198 and on the other side thereof to node 172 through an external pad 200. This comparator configuration has an output defined at node 156 which is utilized to drive the gate of an N-channel driver transistor 202, the source thereof connected to ground and the drain thereof connected to an output node 204. The output node 204 is also connected to the drain of a current source P-channel transistor 206, the source thereof connected to the power supply rail 162 and the gate thereof connected to the node 164. The output node 204 has a feedback capacitor 208 connected on one side thereto, with the other side of the capacitor 208 connected to node 158, the gate of transistor 150. The capacitor 208 has a value of 10 pF and is formed on the chip associated with the oscillator. This feedback capacitor 208 provides a feedback of the output circuit to the positive input. It is noted that the signal at node 156 is somewhat squared up by the active loads 166 and 178, with the output of transistor 150 providing a relatively fast rising and falling edge. The feedback capacitor 208 is sufficient to provide enough instability via a positive feedback configuration to the input of transistor 150 to initiate oscillation. Thereafter, the crystal or resonating element 196 will control the system such that the gain of the circuit is maximized at the resonant frequency of the crystal 196. This will force the circuit to oscillate at the resonant frequency of the crystal 196. This feedback capacitor 208 therefore provides the sufficient instability and phase offset necessary to initiate this oscillation and maintain it.

In summary, there has been provided a CMOS oscillator that utilizes a comparator circuit having two differential input transistors with the sources thereof coupled with a resonator element. The gates of the inverters or the inputs to the comparator circuit are biased to a predetermined voltage, with an active load provided for squaring up the output. The output of the inverter driver has an output transistor which provides a driving function to external circuitry, with the output transistor fed back to the positive input of the differential comparator transistors.

Although the preferred embodiment has been described in detail, it should be understood that various changes, substitutions and alterations can be made therein without departing from the spirit and scope of the invention as defined by the appended claims.

What is claimed is:

1. An integrated circuit oscillator, comprising:
   a first differential leg having a first differential transistor with the source/drain path connected between a first current source and an active load;
   a second differential leg having a second differential transistor with the source/drain thereof connected between a second current source and said active load;
   a resonator element having a resonant frequency connected between the sources of said first and second differential transistors such that the differential gain of said first and second differential legs is optimum at the resonant frequency of said resonant element;
   bias circuitry for biasing the gates of said first and second differential transistors to predetermined voltage levels;
   an output transistor having the gate thereof connected to said active load on the drain of said second differential transistor to drive an output node; and
   a feedback element connected between said output node and the gate of said second differential transistor to provide positive feedback and create an instability in said first and second differential legs to initiate an oscillatory mode.

2. The integrated circuit oscillator of claim 1, wherein said resonator element comprises a crystal.

3. The integrated circuit oscillator of claim 1, wherein said first and second current sources are mirrored from a reference current source.

4. The integrated current oscillator of claim 1, wherein said bias circuitry is operable to bias the gates of said first and second differential transistors to different voltage levels.

5. The integrated circuit oscillator of claim 1, wherein said output transistor has associated therewith an output current source disposed in series therewith, wherein said output current source and said first and second current sources have the current thereof mirrored from a common reference current source.

6. The integrated circuit oscillator of claim 1, wherein said feedback element comprises a capacitor.

7. A method for generating a signal, comprising the steps of:
   providing a first differential leg having a first differential transistor and connecting the source/drain path thereof between a first current source and an active load;
   providing a second differential leg having a second differential transistor and connecting the source/drain path thereof between a second current source and the active load;
   providing a resonator element having a resonant frequency and connecting the resonator element between the sources of the first and second differential transistors such that the differential gain of the first and second differential legs is optimum at the resonant frequency of the resonant element;
   biasing the gates of the first and second differential transistors to predetermined voltage levels;
   providing an output transistor and connecting the gate of the output transistor to the active load on the drain of the second differential transistor to drive an output node; and
   providing a feedback element and connecting the feedback element between the output node and the gate of the second differential transistor to provide a positive feedback and create an instability in the first and second differential legs to initiate an oscillatory mode.

\* \* \* \* \*